US006018554A

United States Patent [19]
Glover

[11] Patent Number: 6,018,554
[45] Date of Patent: Jan. 25, 2000

[54] AUTOMATIC GAIN CONTROL CIRCUIT AND METHOD FOR FULL GAIN RESTART

[75] Inventor: Kerry C. Glover, Wylie, Tex.

[73] Assignee: Texas Instruments Incorporated, Dallas, Tex.

[21] Appl. No.: 08/840,649

[22] Filed: Apr. 24, 1997

Related U.S. Application Data

[60] Provisional application No. 60/017,893, May 17, 1996.

[51] Int. Cl.[7] .................................................. H04L 27/08
[52] U.S. Cl. ......................... 375/345; 455/234.1; 360/46
[58] Field of Search ........................ 375/345; 455/234.1; 360/46, 67

[56] References Cited

U.S. PATENT DOCUMENTS

| 5,297,184 | 3/1994 | Behrens et al. ......................... 375/345 |
| 5,341,249 | 8/1994 | Abbott et al. ............................. 360/46 |

OTHER PUBLICATIONS

Lyle J. Fredrickson, "Viterbi Detection of Matched Spectral Null codes for PR4 Systems," *IEEE Transactions on Magnetics*, vol. 28, No. 5, Sep. 1992, pp. 2889–2891.

K. Chopra and D.D. Woods, "A Maximum Likelihood Peak Detecting Channel," *IEEE Transactions on Magnetics*, vol. 27, No. 6, Nov. 1991, pp. 4819–4821.

Arvind M. Patel, "A New Digital Signal Processing Channel for Data Storage Products," *IEEE Transactions on Magnetics*, vol. 27, No. 6, Nov. 1991, pp. 4579–4584.

Richard C. Schneider, "Sequence (Viterbi–Equivalent) Decoding," *IEEE Transactions on Magnetics*, vol. 24, No. 6, Nov. 1988, pp. 2539–2541.

J.D. Coker, R.L. Galbraith, G.J. Kerwin, J.W. Rae, P.A. Ziperovich, "Implementation of PRML in a Rigid Disk Drive," *IEEE Transactions on Magnetics*, vol. 27, No. 6, Nov. 1991, pp. 4538–4543.

H. Kobayashi and D.T. Tang, "Application of Partial–response Channel Coding to Magnetic Recording Systems," *IBM J. Res. Develop.*, Jul. 1970, pp. 368–375.

Kenneth Abend and Bruce D. Fritchman, "Statistical Detection for Communication Channels with Intersymbol Interference," *Proceedings of the IEEE*, vol. 58, No. 5, May 1970, pp. 779–785.

G. David Forney, Jr., "Maximum–Likelihood Sequence Estimation of Digital Sequences in the Presence of Intersymbol Interference," *IEEE Transactions on Information Theory*, vol. IT–18, No. 3, May 1972, pp. 363–378.

G. David Forney, Jr., "The Viterbi Algorithm," *Proceedings of the IEEE*, vol. 61, No. 3, Mar. 1973, pp. 268–278.

Gottfried Ungerboeck, "Adaptive Maximum–Likelihood Receiver for Carrier–Modulated Data–Transmission Systems," *IEEE Transactions on Communications*, vol. Com–22, No. 5, May 1974, pp. 624–636.

(List continued on next page.)

*Primary Examiner*—Amanda T. Le
*Attorney, Agent, or Firm*—W. Daniel Swayze, Jr.; Wade James Brady, III; Richard L. Donaldson

[57] ABSTRACT

An automatic gain control circuit (44) is provided for generating an output gain signal (64) in a control loop. The control loop may a continuous-time control loop or a sampled-time control loop. The automatic gain control circuit (144) includes a gain control circuit (100), an amplifier circuit such as a first amplifier (120) or a second amplifier (122), a control circuit (126), and a low pass filter (84). The gain control circuit (144) receives a read signal and generates an error signal in response. The first amplifier (120) receives the error signal and generates an amplified error signal. The control circuit (126) controls various switches, such as a first switch (100) and a second switch (102), so that the amplified error signal and the error signal may be provided to the low pass filter (84) during different periods. The amplified error signal is provided during a first period that is shorter than the response time of the control loop. The error signal is provided next after the first period and after a second period that is longer than the response time of the control loop. The low pass filter (84) filters these signals and generates the output gain signal (64).

20 Claims, 2 Drawing Sheets

OTHER PUBLICATIONS

Peter Kabal and Subbarayan Pasupathy, "Partial–Response Signaling," *IEEE Transactions on Communications*, vol. Com–23, No. 9, Sep. 1975, pp. 921–934.

C.T. Beare, "The Choice of the Desired Impulse Response in Combined Linear–Viterbi Algorithm Equalizers," *IEEE Transactions on Communications*, vol. Com–26, No. 8, Aug. 1978, pp. 1301–1307.

R.A. Baugh, E.S. Murdock, and B.R. Natarajan, "Measurement of Noise in Magnetic Media," *IEEE Transactions on Magnetics*, vol. MAG–19, No. 5, Sep. 1983, pp. 1722–1724.

Hans Burkhardt and Lineu C. Barbosa, "Contributions to the Application of the Viterbi Algorithm," *IEEE Transactions on Information Theory*, vol. IT–31, No. 5, Sep. 1985, pp. 626–634.

Yaw–Shing Tang, "Noise Autocorrelation in Magnetic Recording Systems," *IEEE Transactions on Magnetics*, vol. MAG–21, No. 5, Sep. 1985, pp. 1389–1394.

Roger W. Wood and David A. Petersen, "Viterbi Detection of Class IV Partial Response on a Magnetic Recording Channel," *IEEE Transactions on Communications*, vol. COM–34, No. 5, May 1986, pp. 454–461.

Yaw–Shing Tang, "Noise Autocorrelation in High Density Recording on Metal Film Disks," *IEEE Transactions on Magnetics*, vol. MAG–22, No. 5, Sep. 1986, pp. 883–885.

C. Michael Melas, Patrick Arnett, Irene Beardsley, and Dean Palmer, "Nonlinear Superposition in Saturation Recording of Disk Media," *IEEE Transactions on Magnetics*, vol. MAG–23, No. 5, Sep. 1987, pp. 2079–2081.

Dean Palmer, Pablo Ziperovich, Roger Wood, and Thomas D. Howell, "Identification of Nonlinear Write Effects Using Pseudorandom Sequences," *IEEE Transactions on Magnetics*, vol. MAG–23, No. 5, Sep. 1987, pp. 2377–2379.

Roger Wood, "Jitter vs. Additive Noise in Magnetic Recording: Effects on Detection," *IEEE Transactions on Magnetics*, vol. MAG–23, No. 5, Sep. 1987, pp. 2683–2685.

H.K. Thapar and A.M. Patel, "A Class of Partial Response Systems for Increasing Storage Density in Magnetic Recording," *IEEE Transactions on Magnetics*, vol. MAG–23, No. 5, Sep. 1987, pp. 3666–3668.

Yinyi Lin and Jack K. Wolf, "Combined ECC/RLL Codes," *IEEE Transactions on Magnetics*, vol. 24, No. 6, Nov. 1988, pp. 2527–2579.

Catherine A. French, Anthony D. Weathers, and Jack Keil Wolf, "A Generalized Scheme for Generating and Detecting Recording Channel Output Waveforms with Controlled Pulse Polarity," *IEEE Transactions on Magnetics*, vol. 24, No. 6, Nov. 1988, pp. 2530–2532.

Richard C. Schneider, "Write Equalization for Generalized (d,k) Codes," *IEEE Transactions on Magnetics*, vol. 24, No. 6, Nov. 1988, pp. 2533–2535.

Michael Melas, Patrick Arnett, and Jaekyun Moon, "Noise in a Thin Metallic Medium: The Connection with Nonlinear Behaviour," *IEEE Transactions on Magnetics*, vol. 24, No. 6, Nov. 1988, pp. 2712–2714.

Jaekyun J. Moon and L. Richard Carley, "Partial Response Signaling in a Magnetic Recording Channel," *IEEE Transactions on Magnetics*, vol. 24, No. 6, Nov. 1988, pp. 2973–2975.

F. Dollvo, R. Hermann, and S. Olcer, "Performance and Sensitivity Analysis of Maximum–Likelihood Sequence Detection on Magnetic Recording Channels," *IEEE Transactions on Magnetics*, vol. 25, No. 5, Sep. 1989, pp. 4072–4074.

Roger Wood, "New Detector for 1,k Codes Equalized to Class II Partial Response," *IEEE Transactions on Magnetics*, vol. 25, No. 5, Sep. 1989, pp. 4075–4077.

J.W.M. Bergmans, S. Mita, and M. Izumita, "Characterization of Digital Recording Channels by Means of Echo Cancellation Techniques," *IEEE Transactions on Magnetics*, vol. 25, No. 5, Sep. 1989, pp. 4078–4080.

Yinyi Lin, "An Estimation Technique for Accurately Modelling the Magnetic Recording Channel Including Nonlinearities," *IEEE Transactions on Magnetics*, vol. 25, No. 5, Sep. 1989, pp. 4084–4086.

Anthony D. Weathers, Catherine A. French, and Jack Keil Wolf, "Results on 'Controlled Polarity' Modulation and Coding," *IEEE Transactions on Magnetics*, vol. 25, No. 5, Sep. 1989, pp. 4090–4092.

Catherine A. French, "Distance Preserving Run–Length Limited Codes," *IEEE Transactions on Magnetics*, vol. 25, No. 5, Sep. 1989, pp. 4093–4095.

Lyle J. Fredrickson and Jack Keil Wolf, "Error Detecting Multiple Block (d,k) Codes," *IEEE Transactions on Magnetics*, vol. 25, No. 5, Sep. 1989, pp. 4096–4098.

Roger Wood, "Enhanced Decision Feedback Equalization," *IEEE Transactions on Magnetics*, vol. 26, No. 5, Sep. 1990, pp. 2178–2180.

Thomas D. Howell, Donald P. McCown, Thomas A. Diola, Yaw–shing Tang, Karl R. Hense, Ralph L. Gee, "Error Rate Performance of Experimental Gigabit Per Square Inch Recording Components," *IEEE Transactions on Magnetics*, vol. 26, No. 5, Sep. 1990, pp. 2298–2302.

Pantas Sutardja, "A Post–Compensation Scheme for Peak–Detect Channel," *IEEE Transactions on Magnetics*, vol. 26, No. 5, Sep. 1990, pp. 2303–2305.

L.L. Nunnelley, M.A. Burleson, L.L. Williams, and I.A. Beardsley, "Analysis of Asymmetric Deterministic Bitshift Errors in a Hard Disk File," *IEEE Transactions on Magnetics*, vol. 26, No. 5, Sep. 1990, pp. 2306–2308.

H.K. Thapar, N.P.Sands, W.L. Abbott, and J.M. Cioffi, "Spectral Shaping for Peak Detection Equalization," *IEEE Transactions on Magnetics*, vol. 26, No. 5, Sep. 1990, pp. 2309–2311.

Lyle J. Fredrickson, "Coding for Maximum Likelihood Detection on a Magnetic Recording Channel," *IEEE Transactions on Magnetics*, vol. 26, No. 5, Sep. 1990, pp. 2315–2317.

Lyle J. Fredrickson, "A (D,K,C)=(0,3,5/2) Rate 8/10 Modulation Code," *IEEE Transactions on Magnetics*, vol. 26, No. 5, Sep. 1990, pp. 2318–2320.

R. Hermann, "Volterra Modeling of Digital Magnetic Saturation Recording Channels," *IEEE Transactions on Magnetics*, vol. 26, No. 5, Sep. 1990, pp. 2125–2127.

Roger Wood, Mason Williams, and John Hong, "Considerations for High Data Rate Recording with Thin–Film Heads," *IEEE Transactions on Magnetics*, vol. 26, No. 6, Nov. 1990, pp. 2954–2959.

Jaekyun Moon and L. Richard Carley, "Performance Comparison of Detection Methods in Magnetic Recording," *IEEE Transactions on Magnetics*, vol. 26, No. 6, Nov. 1990, pp. 3155–3172.

William L. Abbott, John M. Cioffi, and Hemant K. Thapar, "Performance of Digital Magnetic Recording with Equalization and Offtrack Interference," *IEEE Transactions on Magnetics*, vol. 27, No. 1, Jan. 1991, pp. 705–716.

Jan. W.M. Bergmans, Seiichi Mita, and Morishi Izumita, "A Simulation Study of Adaptive Reception Schemes for High–Density Digital Magnetic Storage," *IEEE Transactions on Magnetics*, vol. 27, No. 1, Jan. 1991, pp. 717–723.

Ching Tsang and Yaw–Shing Tang, "Time–Domain Study of Proximity–Effect Induced Transition Shifts," *IEEE Transactions on Magnetics*, vol. 27, No. 2, Mar. 1991, pp. 795–802.

K.B. Klaassen, "Magnetic Recording Channel Front–Ends," *IEEE Transactions on Magnetics*, vol. 27, No. 6, Nov. 1991, pp. 4503–4508.

John Hong, Roger Wood, David Chan, "An Experimental 180 Mb/sec PRML Channel for Magnetic Recording," *IEEE Transactions on Magnetics*, vol. 27, No. 6, Nov. 1991, pp. 4532–4537.

Jonathan D. Coker, Richard L. Galbraith, and Gregory J. Kerwin, "Magnetic Characterization using Elements of a PRML Channel," *IEEE Transactions on Magnetics*, vol. 27, No. 6, Nov. 1991, pp. 4544–4548.

L. Richard Carley and John G. Kenney, "Comparison of Computationally Efficient Forms of FDTS/DF Against PR4–ML," *IEEE Transactions on Magnetics*, vol. 27, No. 6, Nov. 1991, pp. 4567–4572.

Jaekyun Moon, "Discrete–Time Modeling of Transition–Noise Dominant Channels and Study of Detection Performance," *IEEE Transactions on Magnetics*, vol. 27, No. 6, Nov. 1991, pp. 4573–4578.

Jack Keil Wolf, "A Survey of Codes for Partial Response Channels," *IEEE Transactions on Magnetics*, vol. 27, No. 6, Nov. 1991, pp. 4585–4589.

Norman L. Koren, "Matched Filter Limits and Code Performance in Digital Magnetic Recording," *IEEE Transactions on Magnetics*, vol. 27, No. 6, Nov. 1991, pp. 4594–4599.

H.M. Hilden, D.G. Howe, and E.J. Weldon, Jr., "Shift Error Correcting Modulation Codes," *IEEE Transactions on Magnetics*, vol. 27, No. 6, Nov. 1991, pp. 4600–4605.

Derek D. Kumar and Bill J. Hunsinger, "ACT–enabled 100MHz Channel Equalizer," *IEEE Transactions on Magnetics*, vol. 27, No. 6, Nov. 1991, pp. 4799–4803.

Alan J. Armstrong and Jack Keil Wolf, "Performance Evaluation of a New Coding Scheme for the Peak Detecting Magnetic Recording Channel," *IEEE Transactions on Magnetics*, vol. 27, No. 6, Nov. 1991, pp. 4804–4806.

S. Raghavan and H.K. Thapar, "Feed–Forward Timing Recovery for Digital Magnetic Recording," *International Conference on Communications Conference Record*, vol. 2, 1991, pp. 794–798.

S.A. Raghavan and H.K. Thapar, "On Feed–Forward and Feedback Timing Recovery for Digital Magnetic Recording Systems," *IEEE Transactions on Magnetics*, vol. 27, No. 6, Nov. 1991, pp. 4810–4812.

James Fitzpatrick and Jack Keil Wolf, "A Maximum Likelihood Detector for Nonlinear Magnetic Recording," *IEEE Transactions on Magnetics*, vol. 27, No. 6, Nov. 1991, pp. 4816–4818.

John G. Kenney, Peter Alexis McEwen, and L. Richard Carley, "Evaluation of Magnetic Recording Detection Schemes for Thin Film Media," *IEEE Transactions on Magnetics*, vol. 27, No. 6, Nov. 1991, pp. 4822–4824.

Pablo A. Ziperovich, "Performance Degradation of PRML Channels Due to Nonlinear Distortions," *IEEE Transactions on Magnetics*, vol. 27, No. 6, Nov. 1991, pp. 4825–4827.

Jaekyun Moon and Jian–Gang Zhu, "Nonlinear Effects of Transition Broadening," *IEEE Transactions on Magnetics*, vol. 27, No. 6, Nov. 1991, pp. 4831–4833.

Jaekyun Moon, "Signal–to–Noise Ratio Degradation with Channel Mismatch," *IEEE Transactions on Magnetics*, vol. 27, No. 6, Nov. 1991, pp. 4837–4839.

R.D. Barndt, A.J. Armstrong, H.N. Bertram, and J.K. Wolf, "A Simple Statistical Model of Partial Erasure in Thin Film Disk Recording Systems," *IEEE Transactions on Magnetics*, vol. 27, No. 6, Nov. 1991, pp. 4987–4980.

Y. Tang and C. Tsang, "A Technique for Measuring Nonlinear Bit Shift," *IEEE Transactions on Magnetics*, vol. 27, No. 6, Nov. 1991, pp. 5316–5318.

R.D. Barndt and J.K. Wolf, "Modeling and Signal Processing for the Nonlinear Thin Film Recording Channel," *IEEE Transactions on Magnetics*, vol. 28, No. 5, Sep. 1992, pp. 2710–2712.

H. Thapar, J. Rae, C. Shung, R. Karabed, and P. Siegel, "On the Performance of a Rate 8/10 Matched Spectral Null Code for Class–4 Partial Response," *IEEE Transactions on Magnetics*, vol. 28, No. 5, Sep. 1992, pp. 2883–2888.

Hamid Shafiee and Jaekyun Moon, "Low–Complexity Viterbi Detection for a Family of Partial Response Systems†," *IEEE Transactions on Magnetics*, vol. 28, No. 5, Sep. 1992, pp. 2892–2894.

Weining Zeng and Jaekyun Moon, "Modified Viterbi Algorithm for a Jitter–dominant $1-D^2$ Channel," *IEEE Transactions on Magnetics*, vol. 28, No. 5, Sep. 1992, pp. 2895–2897.

AUTOMATIC GAIN CONTROL CIRCUIT AND METHOD FOR FULL GAIN RESTART

This application claims benefit of provisional application Ser. No. 60/017,893 filed May 17, 1996.

TECHNICAL FIELD OF THE INVENTION

This invention relates generally to the field of information storage and more particularly to an automatic gain control circuit and method for full gain restart.

BACKGROUND OF THE INVENTION

As computer hardware and software technology continues to progress, the need for larger and faster mass storage devices for storing computer software and data continues to increase. Electronic databases and computer applications such as multimedia applications require large amounts of disk storage space.

To meet these ever increasing demands, the hard disk drive (HDD) continues to evolve and advance. Some of the early disk drives had a maximum storage capacity of five megabytes and used fourteen inch platters, whereas today's HDDs are commonly over one gigabyte and use 3.5 inch platters. Advances in the amount of data stored per unit of area, or areal density, have dramatically accelerated. For example, in the 1980's, areal density increased about thirty percent per year while in the 1990's annual areal density increases have been around sixty percent. Areal density may be increased by increasing the rate at which data may be stored and retrieved. The cost per megabyte of an HDD is inversely related to its areal density.

In general, mass storage devices and systems, such as HDDs, include a magnetic storage media, such as rotating disks or platters, a spindle motor, read/write heads, an actuator, a pre-amplifier, a read channel, a write channel, a servo controller, a memory, and control circuitry to control the operation of the HDD and to properly interface the HDD to a host or system bus. The read channel, write channel, servo controller, and memory may all be implemented as one integrated circuit that is referred to as a data channel. Some of the more advanced HDDs may be implemented in mixed-mode circuitry. The control circuitry often includes a microprocessor for executing control programs or instructions during the operation of the HDD.

An HDD performs write, read, and servo operations when storing and retrieving data. As the disk platters are moving, the read/write heads must align or stay on a particular track. This is accomplished by reading information from the disk called a servo wedge. Generally, each sector has a corresponding servo wedge. The servo wedge indicates the position of the heads. The data channel receives this position information so the servo controller can continue to properly position the heads on the track.

A typical HDD performs a write operation by transferring data from a host interface to its control circuitry. The control circuitry then stores the data in a local dynamic random access memory (DRAM). A control circuitry processor schedules a series of events to allow the information to be transferred to the disk platters through a write channel. The read/write heads are moved to the appropriate track and sector. Finally, the HDD control circuitry transfers the data from the DRAM to the sector using the write channel. A sector generally has a fixed data storage capacity, such as 512 bytes of user data per sector. A write clock controls the timing of a write operation in the write channel. The write channel may encode the data so that the data can be more reliably retrieved later.

In a read operation, the appropriate sector to be read is located and data that has been previously written to the disk is read. A read/write head senses the changes in the magnetic flux of the disk platter and generates a corresponding analog read signal. The read channel receives the analog read signal, conditions the signal, and detects "zeros" and "ones" from the signal. The read channel conditions the signal by amplifying the read signal to an appropriate level using an automatic gain control circuit. The read channel then filters the signal, to eliminate unwanted high frequency noise, equalizes the channel, detects "zeros" and "ones" from the signal, and formats the binary data for the control circuitry. The binary or digital data is then transferred from the read channel to the control circuitry and is stored in the DRAM. The processor then communicates to the host that data is ready to be transferred. A read clock controls the timing of a read operation in the read channel. The goal during a read operation is to accurately retrieve the data with the lowest bit error date (BER) in the noisiest environment.

Traditional HDD read channels used a technique known as peak detection for extracting or detecting digital information from the analog information stored on the magnetic media. In this technique, the waveform is simply level detected and if the waveform level is above a threshold during a sampling window, the data is considered a "one." More recently, advanced techniques utilizing discrete time signal processing (DTSP) to reconstruct the original data written to the disk are being used in read channel electronics to improve areal density. In these techniques, the data is synchronously sampled using a data recovery clock. The sample is then processed through a series of mathematical manipulations using signal processing theory.

There are several types of synchronously sampled data (SSD) channels using DTSP. Partial response, maximum likelihood (PRML); extended PRML (EPRML); enhanced, extended PRML (EEPRML); fixed delay tree search (FDTS); and decision feedback equalization (DFE) are several examples of different types of SSD channels using DTSP techniques. The maximum likelihood detection performed in several of these read channels is usually performed by a Viterbi decoder implementing the Viterbi algorithm, named after Andrew Viterbi who developed it in 1967.

The function of the automatic gain control circuit, used in the read channels of DTSP systems, is to generate an appropriate output gain signal that will be used to amplify the analog read signal during a read operation so that the read signal may be efficiently and accurately analyzed by the read channel. The automatic gain control circuit may be part of a continuous-time and a sampled time control loop and may generate a gain signal. The automatic gain control circuit first generates a gain signal as part of the continuous-time control loop and later generates the gain signal as part of the sampled time control loop. When transitioning from the continuous-time control loop to the sampled time control loop, the gain signal should remain somewhat constant, otherwise, data errors may result.

The automatic gain control circuit often uses peak tracking techniques to establish an appropriate gain to be applied to the read signal. Peak tracking involves following the peak of the read signal and calculating a corresponding output gain signal in response. For example, if the peak is too high, the output gain signal is reduced, and if the peak is too low, the output gain signal is increased. Peak tracking does not provide the desired acquisition speed needed in high performance HDD systems.

Peak tracking also suffers the added disadvantage of gain overshoot and undershoot when read signals are provided having non-sinusoidal waveforms. The overshoot and undershoot harms overall HDD performance by increasing the time needed by the automatic gain control circuitry to reach steady state and to provide the appropriate gain. The problem of overshoot and undershoot is especially troubling in more advanced mass storage systems using magneto-resistive heads. Such advanced systems include those utilizing DTSP to reconstruct the original data written to the disk. The magneto-resistive heads often used in these systems provide read signals having non-sinusoidal waveforms causing the automatic gain control circuit to overshoot and undershoot. To compensate for such problems, the automatic gain control circuit must be given more time to determine the appropriate gain. This added time means that more of the HDD capacity must be dedicated to providing header information including an automatic gain control signal. As a consequence, overall HDD capacity is reduced because the remaining available capacity for user data storage is reduced.

In a typical automatic gain control circuit, the time required to acquire the output gain signal is necessarily limited by the control loop response times of the various control loops of the automatic gain control circuit. This adversely increases the time required to generate and acquire the output gain signal. The increased time decreases overall HDD capacity that may be dedicated to user data.

SUMMARY OF THE INVENTION

From the foregoing it may be appreciated that a need has arisen for an automatic gain control circuit and method for full gain restart using an automatic gain control circuit. In accordance with the present invention, an automatic gain control circuit and method for full gain restart are provided for rapidly and efficiently generating an output gain signal. The present invention also provides an output gain signal that properly transitions from a continuous-time control loop to a sampled time control loop and is not limited to the response time of the control loops.

According to the present invention, an automatic gain control circuit for use in a control loop is provided that includes a gain control circuit, an amplifier circuit, a control circuit, and a filter circuit. The automatic gain control circuit may be included as part of a continuous-time control loop or a sampled time control loop. The gain control circuit receives a read signal and generates an error signal that is provided to the amplifier circuit which amplifies the error signal to produce an amplified error signal. The control circuit provides control or switching functions so that the amplified error signal is provided to the filter circuit during a first period that is shorter than the response time of the control loop. The control circuit provides the error signal after a second period that occurs after the first period and which is longer than the response time of the control loop. The filter circuit filters the signal to generate an output gain signal.

The present invention provides various technical advantages. A technical advantage of the present invention includes the ability to rapidly and accurately acquire and generate an output gain signal. This increases overall HDD storage capacity available for user data by reducing the amount of storage capacity dedicated to providing header information used to determine the output gain signal. Another technical advantage of the present invention allows read signals having non-sinusoidal waveforms, such as those provided by magneto-resistive heads, to be accurately processed so that the appropriate output gain signal can be rapidly and accurately generated. The present invention may also reduce latency which improves overall performance. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

Figure 1:
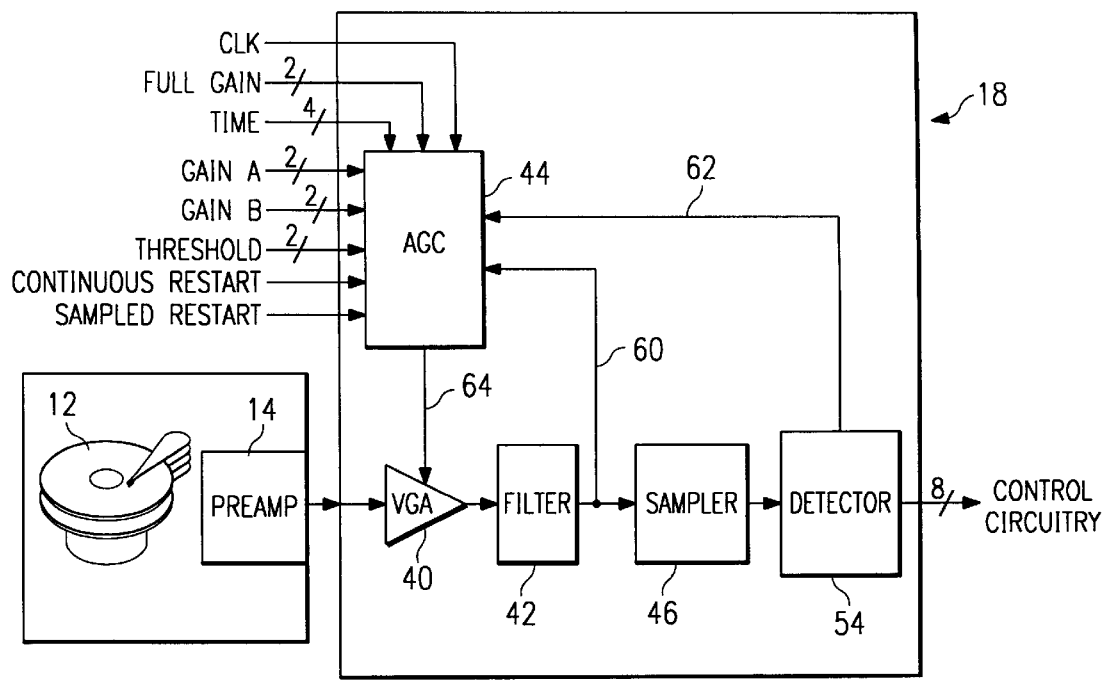
FIG. 1 is a block diagram illustrating a read channel of a disk drive mass storage system.

FIG. 1 is a block diagram of read channel 18 of a disk drive mass storage system. Read channel 18 includes a variety of circuit modules used to process and condition an analog read signal received from a preamplifier 14 and a disk/head assembly 12 during a read operation. The circuit modules of read channel 18 include a variable gain amplifier 40, an automatic gain control circuit 44, a filter 42, a sampler 46, and a detector 54. All of these circuit modules are used during a read operation to perform various functions in processing and conditioning the analog read signal so that a corresponding digital data signal may be rapidly and accurately provided at the output of read channel 18. The digital data signal is provided to control circuitry of the disk drive mass storage system and then to a host or system bus.

Data is stored on the disks of disk/head assembly 12 and is organized into sectors. The data is provided from each sector in the form of the analog read signal. Each sector contains header information and user data that are provided through the analog read signal. The analog read signal provides the header information and then the user data.

Automatic gain control circuit 44 generates an output gain signal 64 and operates as part of a continuous-time control loop when header information is provided by the analog read signal. Automatic gain control circuit 44 also generates output gain signal 64 and operates and as part of a sampled time control loop when the latter portion of the header information is provided and when user data is provided by the analog read signal. Automatic gain control circuit 44 receives a filtered read signal 60 and a sampled read signal 62 during a read operation. Automatic gain control circuit 44 uses filtered read signal 60 to generate output gain signal 64 when operating as part of the continuous-time control loop and sampled read signal 62 when operating as part of the sampled time control loop. Output gain signal 64 is provided to variable gain amplifier 40 and is used to amplify the analog read signal. The continuous-time control loop includes automatic gain control circuit 44, variable gain amplifier 40, and filter 42. The sampled time control loop includes automatic gain control circuit 44, variable gain amplifier 40, filter 42, sampler 46, and detector 54.

Figure 4:
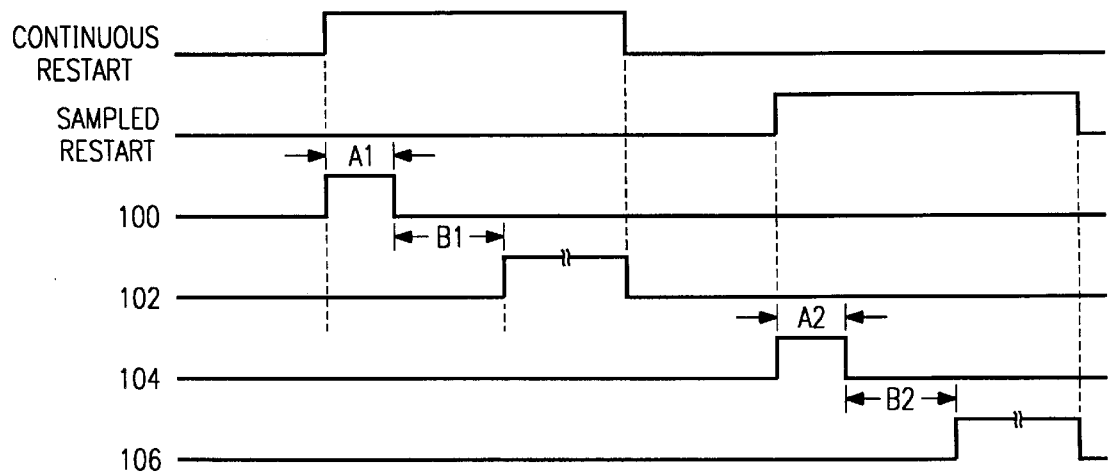
FIG. 4 is a timing diagram illustrating the switching of a first switch, a second switch, a third switch, and a fourth switch.

In generating output gain signal 64, automatic gain control circuit 44 receives a clock signal, shown as CLK, a full gain signal, time period values, shown as TIME, a first gain signal, shown as Gain A, a second gain signal, shown as Gain B, a threshold signal, and a restart signal. The restart signal includes a continuous restart signal and a sampled restart signal. The continuous restart signal is generally provided in an enabled state, as shown in FIG. 4, during the time in which the header information is provided through the analog read signal. The sampled restart signal is generally provided in an enabled state, also shown in FIG. 4, during the time in which the latter portion of the header information is provided and when the user data is provided through the analog read signal.

Variable gain amplifier 40 receives the analog read signal from preamplifier 14 and generates an amplified read signal in response. In doing so, variable gain amplifier 40 receives output gain signal 64 from automatic gain control circuit 44. Variable gain amplifier 40 generates the amplified read signal by amplifying the analog read signal an amount determined by output gain signal 64. Variable gain amplifier 40 may be a differential analog amplifier with variable gain Filter 42 receives the amplified read signal and modifies the signal in a variety of ways such as modifying the gain and removing undesirable noise, such as high frequency noise, to generate filtered read signal 60. Filter 42 may be a continuous-time 7th order filter designed using Gm/C components and may have a programmable cutoff frequency. Filter 42 may also provide Filtered read signal 60 is provided to automatic gain control circuit 44 and sampler 46 as a continuous-time signal.

Sampler 46 receives filtered read signal 60, samples the signal and provides a discrete read signal having discrete values. Sampler 46 converts filtered read signal 60 from continuous time to discrete time. Sampler 46 samples the signal and holds the value until the next sample occurs. The sampling of sampler 46 is controlled by a clock signal generated from a variable frequency oscillator of detector 54. Each discrete value of the discrete read signal corresponds to the value or amplitude of filtered read signal 60 at the time the signal was sampled by sampler 46. Sampler 46 may be implemented as a sample and hold circuit, such as a circular sample and hold circuit, that is time sequence multiplexed to detector 54.

Detector 54 receives the discrete read signal from sampler 46, and generates a digital data signal corresponding to the data stored on disk/head assembly 12 and a sampled read signal 62. Detector 54 may be implemented using any of a variety of circuitry using various techniques for extracting or detecting digital information. For example, detector 54 may be implemented as a discrete time signal processing system such as a synchronously sampled system using PRML detection techniques and employing a Viterbi decoder. After receiving a synchronization field, the detector 54 provides user data, in digital, parallel format, to the control circuitry.

Assuming that detector 54 is implemented as a discrete time signal processing system, detector 54 will generally include an equalizer, such as a finite impulse response filter, an error circuit, a Viterbi decoder, a data synchronization circuit, a deserializer, and a variable frequency oscillator. The equalizer receives the discrete read signal and equalizes the signal to generate an equalized read signal. The equalized read signal is then provided to the error circuit and the Viterbi decoder. The Viterbi decoder analyzes the equalized read signal and generates a digital read signal.

The error circuit generates an error signal that indicates how far the equalized read signal varies from an ideal value. The error signal may serve as sampled read signal 62. The variable frequency oscillator receives the error signal from the error circuit. The variable frequency oscillator also receives a reference clock signal and generates the clock signal and response. The clock signal is used to control the sample time of sampler 46.

The deserializer receives the digital read signal from the Viterbi decoder and converts the signal from serial format to parallel format. Finally, the data synchronization circuit receives the digital read signal from the deserializer and generates a synchronization detect signal once the synchronization field is detected. The synchronization field indicates that user data will be provided next. Detector 54 then provides digital data to the control circuitry in parallel format.

In operation, read channel 18 receives the analog read signal containing header information. The continuous-time control loop is used to generate output gain signal 64. Automatic gain control circuit 44, described more fully below with respect to FIGS. 2–4, receives filtered read signal 60 and generates output gain signal 64 after a continuous restart signal is enabled. During the time that the continuous restart signal is enabled, the continuous-time control loop will respond to the analog read signal and will settle to a steady state level resulting in a stable output gain signal 64 being provided to variable gain amplifier 40. After the continuous restart signal is unenabled, automatic gain control circuit 44 maintains this stable output gain signal 64 until a sampled time control loop can be used to generate output gain signal 64.

Next, the sampled restart signal is enabled and read channel 18 receives the latter part of the header information and the user data through the analog read signal. The sampled time control loop is now used to generate output gain signal 64. Automatic gain control circuit 44 receives sampled read signal 62 and generates output gain signal 64.

Figure 2:
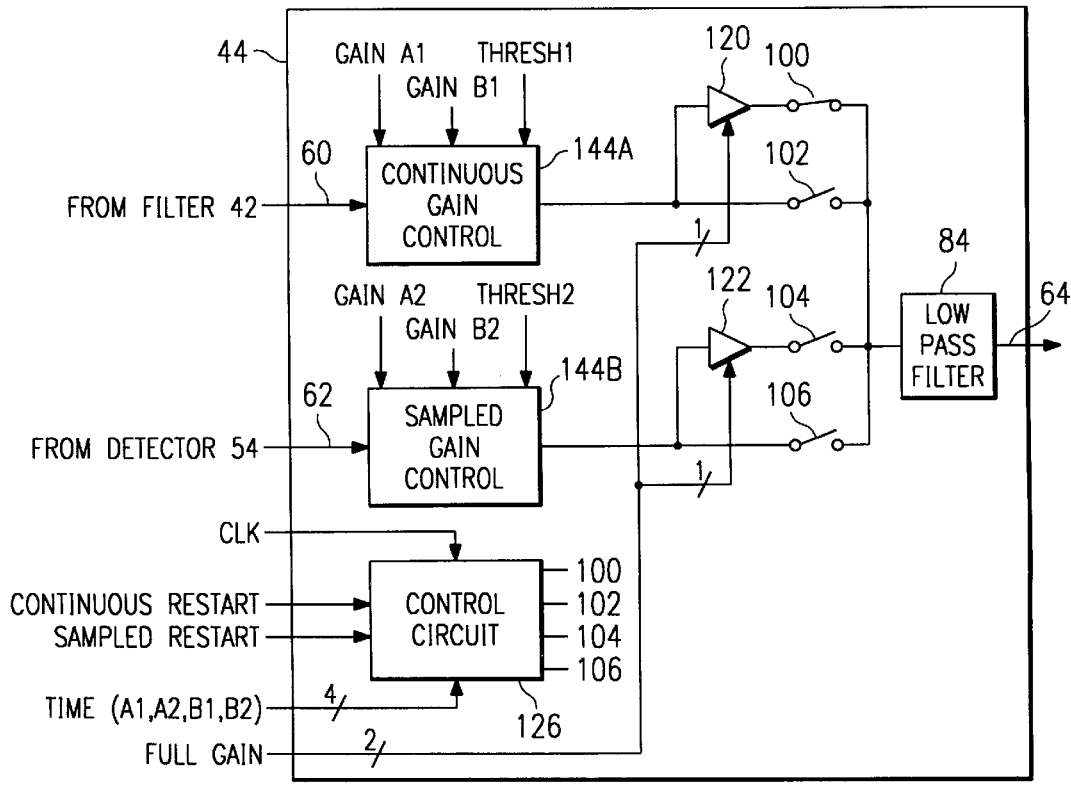
FIG. 2 is a block diagram of an automatic gain control circuit of the read channel.

FIG. 2 is a block diagram of automatic gain control circuit 44 of read channel 18 that is used to generate the output gain signal 64. Automatic gain control circuit 44 functions as part of the continuous-time control loop and as part of the sampled time control loop. When functioning as part of the continuous-time control loop, automatic gain control circuit 44 receives filtered read signal 60 and generates output gain signal 64. Automatic gain control circuit 44 functions as part of the continuous-time control loop during the time in which header information is provided by the analog read signal. During the time in which automatic gain control circuit 44 functions as part of the sampled time control loop, automatic gain control circuit 44 receives sampled read signal 62 and generates output gain signal 64.

Automatic gain control circuit 44 includes a continuous gain control circuit 144A, a sampled gain control circuit 144B, a control circuit 126, a first amplifier 120, a second amplifier 122, various switches, and a low pass filter 84. Continuous gain control circuit 144A and sampled gain control circuit 144B contain the same or similar circuitry and are further described below with reference to the gain control circuit 144 of FIG. 3.

Control circuit 126 receives various signals and includes various timing circuits that are used to control the operation of the switches of automatic gain control circuit 44. The switches include a first switch 100, a second switch 102, a third switch 104, and a fourth switch 106. These switches determine which signal will be provided as an input to low pass filter 84. Only one of these switches is closed at any given time. Control circuit 126 receives the clock signal (shown as CLK), the time period values (shown as TIME (A1,A2,B1,B2)), and the restart signal. The restart signal includes the continuous restart signal and the sampled restart signal. When the continuous restart signal is enabled, control circuit 126 closes first switch 100 during a first period A1. After the first period A1 and the second period B1, second switch 102 will be closed. When the sampled restart signal is enabled, control circuit 126 closes second switch 104 during a third period A2. After the third period A2 and the fourth period B2, control circuit 126 closes fourth switch 106. Each of the time periods are programmable values and are related to the response times of the continuous-time control loop and the sampled time control loop.

Continuous gain control circuit 144A receives filtered read signal 60 from filter 42 and generates a continuous-time error signal in response. Continuous gain control circuit 144A also receives a first gain signal, shown as Gain A1, a second gain signal, shown as Gain B1, and a threshold signal shown as Thresh 1. The continuous-time error signal is provided to first amplifier 120 and second switch 102. First amplifier 120 also receives a first full gain signal. The first full gain signal is used to control the gain of first amplifier 120 and may be a programmable value.

First amplifier 120 amplifies the continuous-time error signal and generates an amplified continuous-time error signal. During the first period A1, and as detailed more fully in FIG. 4, the amplified continuous-time error signal is then provided to low pass filter 84 through first switch 100. During the first period A1, control circuit 126 closes first switch 100 which allows the amplified continuous-time error signal to be provided to low pass filter 84. The first period A1 is provided at some period of time which is less than the response time of the continuous-time control loop. After the first period A1 expires, control circuit 126 opens first switch 100. After the second period B1, control circuit 126 closes the second switch 102 so that the continuous-time error signal is provided to low pass filter 84. The length of the second period B1 is some time period greater than the response time of the continuous-time control loop. Control circuit 126 maintains second switch 102 in a closed state until the continuous restart signal transitions from an enabled state to an unenabled state.

At some later point in time, the sampled restart signal, provided to control circuit 126, will transition from an unenabled state to an enabled state. Automatic gain control circuit 44 now operates as part of the sampled time control loop. In doing so, sampled gain control circuit 144B receives sampled read signal 62 from detector 54 and generates a sampled time error signal in response. Sampled gain control circuit 144B also receives a third gain signal, shown as Gain A2, a fourth gain signal, shown as Gain B2, and a threshold signal shown as Thresh 2 which are all used in generating the sampled time error signal and are described more fully with respect to FIG. 3. The sampled time error signal is provided to second amplifier 122 and fourth switch 106. Second amplifier 122 also receives a second full gain signal which is used to control the gain of second amplifier 122. The second full gain signal may be a programmable value.

Second amplifier 122 amplifies the sampled time error signal and generates an amplified sampled time error signal. During the third period A2, beginning when the sampled restart signal transitions from an unenabled state to an enabled state, third switch 104 is closed. This enables the amplified sampled time error signal to be provided to low pass filter 84. Third period A2 is a programmable period provided to control circuit 126 and will be some time period less than the response time of the sampled time control loop. Third switch 104, as controlled by control circuit 126, is opened after the third period A2 expires. At this time, the fourth period B2 begins and lasts for a period of time greater than the response time of the sampled time control loop. After the expiration of the fourth period B2, control circuit 126 closes fourth switch 106. This allows the sampled time error signal to be provided to low pass filter 84. Fourth switch 106 remains closed until the sampled restart signal transitions from an enabled state to an unenabled state.

Low pass filter 84 receives and filters the various error signals provided through the various switches. Low pass filter 84 generates output gain signal 64 by averaging the input error signal. Output gain signal 64 is provided to variable gain amplifier 40 and controls the gain or amplification provided to the analog read signal. During second period B1 and fourth period B2, low pass filter 84 maintains the last output gain signal 64 generated. Low pass filter 84 may be implemented using any of a variety of circuit elements. For example, low pass filter 84 may be implemented using passive components such as a resistor and a capacitor, or using active components such as an operational amplifier. Low pass filter 84 will generally be designed to ensure low current leakage so that output gain signal 64 can be accurately maintained when all of the various switches are open.

Figure 3:
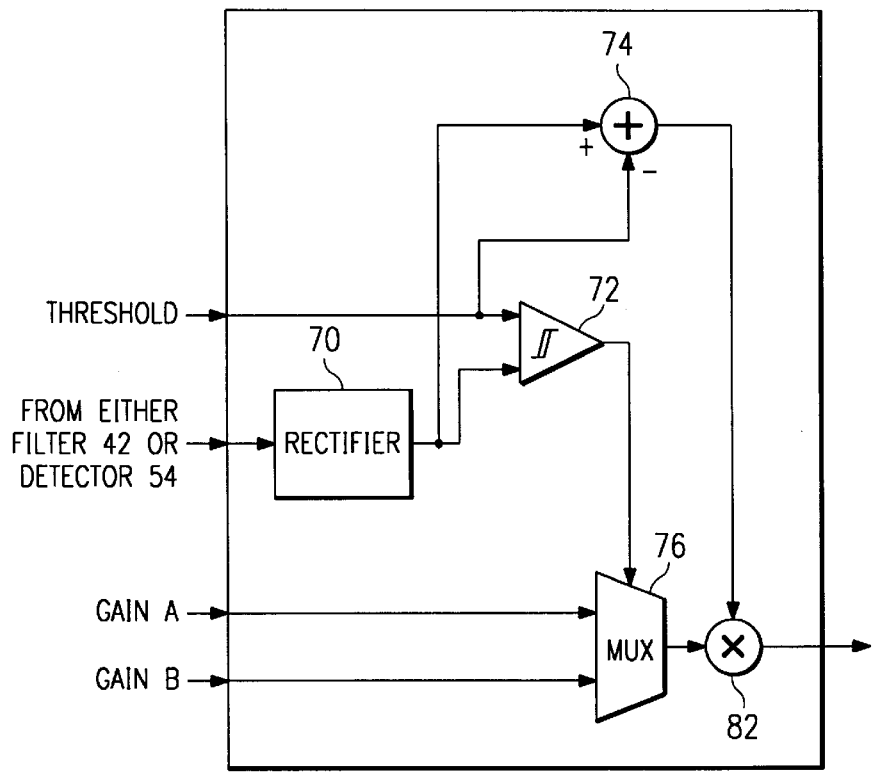
FIG. 3 is a block diagram of a gain control circuit of the automatic gain control circuit.

FIG. 3 is a block diagram of a gain control circuit 144 of automatic gain control circuit 44. Gain control circuit 144 may be implemented as continuous gain control circuit 144A or as sampled gain control circuit 144B, both of FIG. 2. Gain control circuit 144 includes a variety of circuit elements used to receive an input signal, such as filtered read signal 60 or sampled read signal 62, and to generate an error signal, such as the continuous-time error signal or the sampled time error signal, respectively. Gain control circuit 144 includes a rectifier 70 for rectifying the input signal and generating a rectified read signal. The rectified read signal is provided to an adder circuit 74 and a comparator 72.

In addition to the rectified read signal, comparator 72 also receives a threshold signal, such as Thresh1 or Thresh2 of FIG. 2, and compares the threshold signal to the rectified read signal to generate a comparison signal that indicates whether the rectified read signal is above or below the threshold signal. For example, comparator 72 may generate a comparison signal which is equal to a value of "one" when the rectified read signal is greater than the threshold signal and is equal to a value of "zero" when the rectified read signal is less than the threshold signal. The threshold signal may be a programmable value that can be provided over a range of values. The comparison signal is provided to a multiplexer 76 and controls its operation.

Adder circuit 74 receives the rectified read signal along with the threshold signal. Adder circuit 74 subtracts the value of the threshold signal from the value of the rectified read signal to generate an offset signal. Other embodiments of the present invention, not shown in FIG. 3, may include other circuitry for determining the difference between the rectified read signal and the threshold signal. Furthermore, the threshold signal provided to adder circuit 74 is shown in FIG. 3 as being the same threshold signal that is provided to comparator 72. In actual practice, the threshold signal may be provided as two separate signals having different values.

Gain control circuit 144 also receives Gain A and Gain B, such as Gain A1, B1, A2, and B2 shown in FIG. 2. Gain A and Gain B may be programmable values that are provided as either analog or digital values. These gain signals are provided as inputs to multiplexer 76. Multiplexer 76 operates as a selection circuit and is controlled by the comparison signal provided by comparator 72. Multiplexer 76 selects either Gain A or Gain B, as determined by the comparison signal, to be provided at the output of multiplexer 76. Whenever the comparison signal indicates that the rectified read signal is greater than the threshold signal, Gain A is provided at the output of multiplexer 76. Conversely, whenever the rectified read signal is less than the threshold signal, Gain B is provided as the output of multiplexer 76. Gain A and Gain B are gain signals that are ultimately multiplied, as described below, with the offset signal. The value of these gain signals may be equivalent but will generally be provided at some ratio of one another.

A multiplier circuit 82 receives the output of multiplexer 76 and the offset signal of adder circuit 74. Multiplier 84 multiplies these two signals and generates an error signal. The error signal is provided as the output of gain control signal 144.

In operation, rectifier 70 receives an input signal, such as filtered read signal 60 or sampled read signal 62, and rectifies the signal to generate the rectified read signal. The rectified read signal is provided to adder circuit 74 and comparator 72. Comparator 72 generates a comparison signal indicating whether the rectified read signal is greater than or less than the threshold signal. Adder circuit 74 subtracts the threshold signal from the rectified read signal to generate an offset signal that is provided to multiplier circuit 82. Multiplexer 76, as controlled by the comparison signal, provides either Gain A or Gain B to multiplier circuit 82. The Gain A signal is provided when the rectified read signal is greater than the threshold signal and the Gain B signal is provided when the rectified read signal is less than the threshold signal. Multiplier 82 multiplies the selected gain signal with the offset signal and generates the error signal. When gain control circuit 144 is implemented as continuous gain control circuit 144A of FIG. 2, the error signal is the continuous-time error signal. When gain control circuit 144 is implemented as sampled gain control circuit 144B of FIG. 2, the error signal is the sampled time error signal.

FIG. 4 is a timing diagram illustrating the switching of first switch 100, second switch 102, third switch 104, and fourth switch 106 of automatic gain control circuit 44 so that the appropriate error signal may be provided to low pass filter 84. Control circuit 126 controls the operation of these switches. Control circuit 126, shown in FIG. 2, receives various control signals that are used in controlling the switches. The various control signals include the CLK, the continuous restart signal, the sampled restart signal, and various time period values. The continuous restart signal is provided in an enabled state during the time in which automatic gain control circuit 44 functions as part of the continuous-time control loop. The sampled restart signal is provided in an enabled state during the time in which automatic gain control circuit 44 functions as part of the sampled time control loop. The time period values are programmable values and include the first period A1, the second period B1, the third period A2, and the fourth period B2.

First switch 100 and second switch 102 operate when the continuous restart signal is in an enabled state. First switch 100 is closed for the first period A1, beginning when the continuous restart signal is enabled. This allows the amplified continuous-time error signal to be provided to low pass filter 84. The first period A1 is equivalent to some period of time that is less than the response time of the continuous-time control loop so that output gain signal 64 may be rapidly increased. Once again, the continuous-time control loop includes automatic gain control circuit 44, variable gain amplifier 40, and filter 42. After the expiration of the first period A1, first switch 100 is opened and the second period B1 begins. The second period B1 extends for a period of time greater than the response time of the continuous-time control loop. This allows for the effect on the continuous-time control loop, brought about by the amplified continuous-time error signal, to be seen. After the expiration of the second period B1, second switch 102 transitions from open to closed. This allows the continuous-time error signal to be provided to low pass filter 84. Second switch 102 remains closed until the continuous restart signal goes from an enabled state to an unenabled state.

Third switch 104 and fourth switch 106 operate similarly to first switch 100 and second switch 102. Third switch 104 and fourth switch 106 are used during the time in which the sampled restart signal is provided in an enabled state. The time that the sampled restart signal is provided in an enabled state corresponds generally to the time in which automatic gain control circuit 44 functions as part of the sampled time control loop.

As soon as the sampled restart signal transitions from an unenabled state to an enabled state, the third period A2 begins and third switch before transitions from open to closed. This allows the amplified sampled time error signal to be provided to low pass filter 84. Third period A2 lasts for a period of time that is less than the response time of the sampled time control loop so that output gain signal 64 may be rapidly increased. After the third period A2 expires, third switch 104 opens and the fourth period B2 begins. Fourth period B2 lasts for a period of time greater than the response time of the sampled time control loop. This allows for the effect on the sampled time control loop, brought about by the amplified sampled time error signal, to be seen. After the expiration of the fourth period B2, fourth switch 106 transitions from open to closed so that the sampled time error signal may be provided to low pass filter 84. Fourth switch 106 remains closed until the sampled restart signal transitions from an enabled state to an unenabled state. This signifies the end of a read operation for a particular sector of data.

Thus, it is apparent that there has been provided, in accordance with the present invention, an automatic gain control circuit and method for full gain restart so that an output gain signal can be rapidly and efficiently generated and satisfies the advantages set forth above. Although the preferred embodiment has been described in detail, it should be understood that various changes, substitutions, and alterations can be made herein. For example, a variety of different threshold values may be provided for use in gain control circuit 144. One threshold may be provided to comparator 72 while a different or related threshold may be provided to adder circuit 74. Many of the signals provided to automatic gain control circuit 44 may be programmable signals. Also, the present invention is not limited to the specific read signals provided to automatic gain control circuit 44, namely, filtered read signal 60, used in the continuous-time control loop, and sampled read signal 62, used in the sampled time control loop. The present invention encompasses the use of related, but different signals. Furthermore, the direct connections illustrated herein could be altered by one skilled in the art such that two devices are merely coupled to one another through an intermediate device or devices without being directly connected while still achieving the desired results demonstrated by the present invention. Other examples of changes, substitutions, and alterations are readily ascertainable by one skilled in the art and could be made without departing from the spirit and scope of the present invention. While the invention has been particularly shown and described by the foregoing detailed description, it will be understood by those skilled in the art that various other changes in form and detail may be made without departing from the spirit and scope of the invention as defined by the following claims.

What is claimed is:

1. An automatic gain control circuit for use in a control loop, the automatic gain control circuit comprising:
   a gain control circuit operable to receive a read signal and to generate an error signal in response;
   an amplifier circuit operable to receive the error signal and to generate an amplified error signal in response;
   a control circuit operable to provide the amplified error signal during a first period that is shorter than the response time of the control loop, the control circuit operable to provide the error signal after a second period, the second period occurring after the first period, the second period being longer than the response time of the control loop; and
   a filter circuit operable to receive the signal provided by the control circuit and to generate an output gain signal.

2. The automatic gain control circuit of claim 1, wherein the read signal is a continuous-time read signal.

3. The automatic gain control circuit of claim 2, wherein the continuous-time read signal is provided by a low pass filter.

4. The automatic gain control circuit of claim 1, wherein the read signal is a sampled read signal.

5. The automatic gain control circuit of claim 4, wherein the sampled read signal is provided by a detector.

6. The automatic gain control circuit of claim 4, wherein the sampled read signal is provided as the output of an error circuit.

7. The automatic gain control circuit of claim 1, wherein the filter is a low pass filter.

8. The automatic gain control circuit of claim 1, wherein the first amplifier is provided with a programmable full gain signal.

9. The automatic gain control circuit of claim 1, wherein the first period and the second period are programmable periods.

10. The automatic gain control circuit of claim 1, wherein the gain control circuit comprises:
    a rectifier circuit operable to rectify the read signal and to generate a rectified read signal;
    a comparator operable to receive the rectified read signal and a threshold signal and to provide a comparison signal in response;
    an adder circuit operable to receive the rectified read signal and the threshold signal and to subtract the threshold signal from the rectified read signal to generate an offset signal; and
    a multiplier circuit operable to multiply the offset signal and a gain signal to generate an error signal.

11. An automatic gain control circuit for use in controlling a first control loop and a second control loop, the automatic gain control circuit comprising:
    a first gain control circuit operable to receive a continuous-time read signal and to generate a continuous-time error signal in response;
    a second gain control circuit operable to receive a sampled read signal and to generate a sampled error signal in response;
    a first amplifier circuit operable to receive the continuous-time error signal and to generate an amplified continuous-time error signal in response;
    a second amplifier circuit operable to receive the sampled error signal and to generate an amplified sampled error signal in response;
    a control circuit operable to provide the amplified continuous-time error signal during a first period that is shorter than the response time of the first control loop, the control circuit operable to provide the continuous-time error signal after a second period, the second period occurring after the first period, the second period being longer than the response time of the first control loop, the control circuit operable to provide the amplified sampled error signal during a third period that is shorter than the response time of the second control loop, the control circuit operable to provide the sampled error signal after a fourth period, the fourth period occurring after the third period, the fourth period being longer than the response time of the second control loop; and
    a filter circuit operable to receive the signal provided by the control circuit and to generate an output gain signal.

12. The automatic gain control circuit of claim 11, wherein the continuous-time read signal is provided by a low pass filter.

13. The automatic gain control circuit of claim 11, wherein the sampled read signal is provided by a detector.

14. The automatic gain control circuit of claim 11, wherein the sampled read signal is provided as the output of an error circuit.

15. The automatic gain control circuit of claim 11, wherein the filter is a low pass filter.

16. The automatic gain control circuit of claim 11, wherein the first amplifier is operable to receive a programmable, first full gain signal and the second amplifier is operable to receive a programmable, second full gain signal.

17. The automatic gain control circuit of claim 11, wherein the first period, the second period, the third period, and the fourth period are programmable periods.

18. A method for full gain restart using an automatic gain control circuit in a control loop, the method comprising the steps of:
    receiving a read signal;
    rectifying the read signal to generate a rectified read signal;
    comparing the rectified read signal to a threshold value;
    generating an offset signal by subtracting the threshold value from the rectified read signal;
    generating an error signal by multiplying the offset signal by a gain signal, the gain signal provided in response to the comparing the rectified read signal step;
    amplifying the error signal to generate an amplified error signal;
    providing the amplified error signal to a filter during a first period that is shorter than the response time of the control loop; and
    providing the error signal to the filter after a second period, the second period occurring after the first period, the second period being longer than the response time of the control loop.

19. The method of claim 18 wherein, the read signal is a continuous-time read signal.

20. The method of claim 18 wherein, the read signal is a sampled read signal.

* * * * *